United States Patent
Motta et al.

(10) Patent No.: US 7,265,557 B2
(45) Date of Patent: Sep. 4, 2007

(54) METHOD AND CIRCUIT FOR MEASURING CHARACTERISTIC PARAMETERS OF INTERMODULATION DISTORTION

(75) Inventors: Carla Motta, Catania (IT); Giovanni Girlando, Catania (IT); Alessandro Castorina, Aci Catena (IT); Giuseppe Palmisano, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/349,305

(22) Filed: Feb. 7, 2006

(65) Prior Publication Data

US 2006/0290358 A1 Dec. 28, 2006

(30) Foreign Application Priority Data

Feb. 8, 2005 (IT) .......................... VA2005A0006

(51) Int. Cl.
*G01R 23/20* (2006.01)
*H04B 1/10* (2006.01)

(52) U.S. Cl. ................. 324/624; 324/620; 702/69; 702/191

(58) Field of Classification Search ............... 324/624, 324/620
See application file for complete search history.

(56) References Cited

U.S. PATENT DOCUMENTS

| | | | | |
|---|---|---|---|---|
| 4,246,535 A * | 1/1981 | Huang et al. | ............... | 324/602 |
| 5,133,083 A * | 7/1992 | Crilly et al. | ................. | 455/45 |
| 5,748,001 A * | 5/1998 | Cabot | ........................ | 324/624 |
| 6,229,316 B1 * | 5/2001 | Fukui et al. | ................ | 324/624 |
| 6,263,289 B1 * | 7/2001 | Hassun et al. | ................ | 702/69 |
| 6,567,762 B2 * | 5/2003 | Bourde et al. | ............. | 702/107 |
| 6,766,262 B2 * | 7/2004 | Martens | ....................... | 702/69 |
| 7,123,023 B2 * | 10/2006 | Minihold et al. | .......... | 324/624 |

* cited by examiner

*Primary Examiner*—Walter Benson
*Assistant Examiner*—John Zhu
(74) *Attorney, Agent, or Firm*—Lisa K. Jorgenson; Allen, Dyer, Doppelt, Milbrath & Gilchrist, P.A.

(57) ABSTRACT

An arrangement is for measuring characteristic parameters of intermodulation distortion of a device under test. The arrangement may include a generator of at least two tones at different test frequencies, and an attenuation path feeding the device with a replica of the two tones attenuated of a factor equal to the gain of the device. The arrangement may also include a circuit for generating a difference signal between the signal output by the device and the two tones, and a circuit input with the difference signal and measuring the characteristic parameters as a function thereof.

16 Claims, 4 Drawing Sheets

METHOD AND CIRCUIT FOR MEASURING CHARACTERISTIC PARAMETERS OF INTERMODULATION DISTORTION

FIELD OF THE INVENTION

This invention relates to measuring linearity characteristics of a device, and, more particularly, to a method and a circuit for measuring the third order intercept points of a device.

BACKGROUND OF THE INVENTION

A main requirement of circuits working at radio-frequencies is linearity. Linearity of low-noise amplifiers is typically characterized by special parameters commonly indicated with the acronyms IIP3 and OIP3, respectively the input and output "third order intercept points", that measure the intermodulation distortion (IM3) introduced by the amplifiers.

Classic measuring instruments allow estimating the parameter OIP3, the maximum value of which is limited by nonlinearities introduced by the instruments. Therefore, measurements carried out on highly linear circuits are carried out with great care. The meaning of the parameters IIP3, IM3 and OIP3, that characterize intermodulation distortions, are briefly illustrated hereinbelow for better understanding the field of the invention.

DEFINITION OF PARAMETERS IM3, IIP3 AND OIP3

If a signal including two tones at different test frequencies, $\omega_1$ and $\omega_2$, is input to an amplifier, the spectrum of the output signal is as depicted in FIG. 1 because of nonlinearities of the amplifier. Besides the two output tones at the test frequencies $\omega_1$ and $\omega_2$ and other output spurious tones relatively far from the frequencies of interest, the amplifier generates two spurious tones at frequencies $2\cdot\omega_2-\omega_1$ and $2\cdot\omega_1-\omega_2$. With P1 being the power of the output tone at the frequency $\omega_1$ (equal to that of the output tone at the frequency $\omega_1$), and P3 being the power of the spurious output tone at the frequency $2\cdot\omega_2-\omega_1$ or at $2\cdot\omega_1-\omega_2$, the parameter IM3 is the ratio expressed in dB between the powers P1 and P3, as schematically illustrated in FIG. 2 and represented by: IM3=10 log (P3/P1).

FIG. 3 shows a typical graph of the powers P1 and P3 in dBm when the input power Pin, in dBm, varies. For low input powers Pin, the power of the main output tone P1 is substantially linear along a straight line $t_1$ having a slope of 1 dB/dB, while the power of the spurious tone P3 is substantially linear along a straight line $t_3$ having a slope of 3 dB/dB.

Beyond a certain input power, such graphs change because of nonlinearities of order larger than the third and/or because of saturation of the amplifier. The input power in correspondence of which the two straight lines $t_1$ and $t_3$ intersect each other is the parameter IIP3, also known as "input third-order intercept point". The output power $P_0$ in correspondence of which the two straight lines $t_1$ ad $t_3$ intersect each other is the parameter OIP3, also known as "output third-order intercept point".

The known techniques for improving linearity characteristics of electronic devices substantially shift down the straight line $t_3$, while keeping its slope at a value of 3 dB/dB. In so doing, the intersection point between the straight lines $t_1$ and $t_3$ is at a higher power Pin. The parameter IIP3 expressed in dBm is tied to the parameter IM3 expressed in dB through the following relation:

$$IIP3[dBm]=Pin[dBm]-\tfrac{1}{2}*IM3[dB].$$

The parameter OIP3 expressed in dBm is defined by the following formula:

$$OIP3[dBm]=IIP3[dBm]+G[dB]$$

wherein G is the power gain of the amplifier.

FIG. 4 shows a classic scheme for measuring the parameter OIP3 of a device DUT (Device Under Test). The two tones at frequencies $\omega_1$ and $\omega_2$ are summed up by a so-called "power combiner" $\Sigma$ and feed to the device DUT, while the output of the device is sent to a spectrum analyzer. This scheme is not very efficient because nonlinearities introduced by the input stage of the spectrum analyzer generate measurement errors when the power of the signal to be measured is high. For this reason, with the scheme of FIG. 4 and with the available spectrum analyzers it is possible to measure in a sufficiently accurate manner the parameter OIP3 only if it does not exceed about 25 dBm.

An attenuator downstream of the DUT is not useful because it would attenuate also the intermodulation tones generated by the device DUT and would bring them close or even below the background noise of the spectrum analyzer. A technique for measuring characteristic parameters of intermodulation distortion, disclosed in U.S. Pat. No. 6,263,289 by Hassun and Kuhn, is illustrated in FIG. 5. The measurement arrangement of FIG. 5 has a loop for canceling the output tones at the frequencies $\omega_1$ and $\omega_2$, such to feed the spectrum analyzer only with the spurious tones generated by the device DUT.

More particularly, a "directional coupler" upstream of the device DUT produces an attenuated replica of the tones generated by the "power combiner" $\Sigma$, that is provided to the attenuator A1 and from this to the phase-shifter $\phi$. Another "directional coupler" provides an attenuated replica of the output of the DUT to the attenuator A2. The power combiner $\Sigma$, upstream the spectrum analyzer, receives the signal X generated by the DUT and attenuated according to a certain attenuation factor, and the input signal Y properly phase shifted by a phase $\phi$ and attenuated with a different attenuation factor.

The factors A1 and A2 and the phase shift $\phi$ are determined for realizing the condition Y=-X, excluding nonlinearities introduced by the device DUT. In so doing, the signal Z is ideally provided by the sole intermodulation distortions generated by the device DUT. The power that is input to the spectrum analyzer is such that the latter practically does not introduce further nonlinearities.

Hassun and Kuhn refer to the so-called "adjacent channel power ratio" (ACPR), that requires a W-CDMA source. The signal W-CDMA has a bandwidth of 5 MHz, thus the generator of the input signal outputs low power signals for generating tones without (or with a negligible) distortion. Moreover, to make the signals X and Y have the same amplitude, the attenuation factor A2 equals the sum (in dB) between the gain of the device DUT and the attenuation factor A1. A drawback of this circuit is that the level of output tones may be below the background noise level of the spectrum analyzer.

To better understand this aspect, let us suppose using the circuit by Hassun and Kuhn for measuring characteristic parameters of the intermodulation distortion of a device for which OIP3 equals 40 dBm and the power gain is 20 dB and for which, for an input tone of a power of −40 dBm, the power P3 of a spurious output tone varies by 3 dB/dB. Thus the two main output tones of the DUT have a power of −20 dBm, while the two spurious intermodulation tones have a power of −140 dBm, equal to the background noise detected by the spectrum analyzer.

If the spectrum analyzer did not introduce any distortion, it would be possible to measure the parameter OIP3 even if 40 dBm. By using the method of Hassun and Kuhn, illustrated in FIG. 6, the power of spurious intermodulation tones that input the spectrum analyzer is −176 dBm. Since the background noise of the instrument is equal to −140 dBm, the two intermodulation tones are 36 dB below the noise level, thus this method cannot be used in the considered sample case.

To make the level of the spurious intermodulation tones input to the spectrum analyzer at least equal to the background noise, it is necessary that the power of these spurious tones output by the device DUT be at least equal to −104 dBm. The maximum value of the parameter OIP3 that may be measured for an output power of −20 dBm, that represents the dynamic measurement interval at the power of −20 dBm, is thus:

$$OIP3 = \text{Pout} - \frac{1}{2} * IM3 = \frac{-20 + (104 - 20)}{2} = -20 + 42 = 22 dBm$$

With the method disclosed in the above mentioned patent, the dynamic measurement range for an output power of −20 dBm is 18 dB smaller than the maximum theoretic dynamic range.

SUMMARY OF THE INVENTION

Investigations carried out by the applicants over the method of Hassun and Kuhn showed that the dynamic range is reduced by one half of the attenuation factor, downstream of the DUT, when the power of the spurious tones equals the power of the background noise. This observation led the applicants to look for a new method for measuring characteristic parameters of the intermodulation distortion of a device without attenuating the output of the device, so as not to attenuate also the spurious tone and risk bringing them below the background noise of the spectrum analyzer.

A circuit and a method have been found for measuring characteristic parameters of intermodulation distortion of a device with a dynamic range practically equal to the ideal range, whatever the output power of the device and whatever the background noise level of the spectrum analyzer are.

This extraordinary result has been obtained by feeding the device with a pair of test tones attenuated by a factor equal to the gain of the device, thus generating a difference signal wherein the output tones of the device at the main frequencies are canceled by subtracting from the output of the device a replica of the two test tones, and feeding the difference signal to the spectrum analyzer. Therefore, the output tones of the device at the main frequencies are deleted whatever their power is, and the spurious output tones are measured by the spectrum analyzer without being attenuated.

BRIEF DESCRIPTION OF THE DRAWINGS

The invention will be described referring to the attached drawings, wherein.

DETAILED DESCRIPTION OF THE PREFERRED EMBODIMENTS

Figure 1:
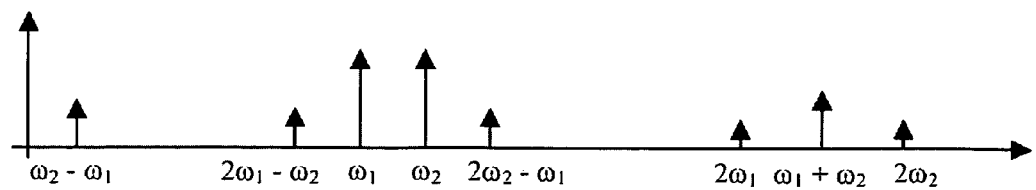
FIG. 1 shows a sample output spectrum of an amplifier input with two tones at frequencies $\omega_1$ and $\omega_2$ as in the prior art.
Figure 2:
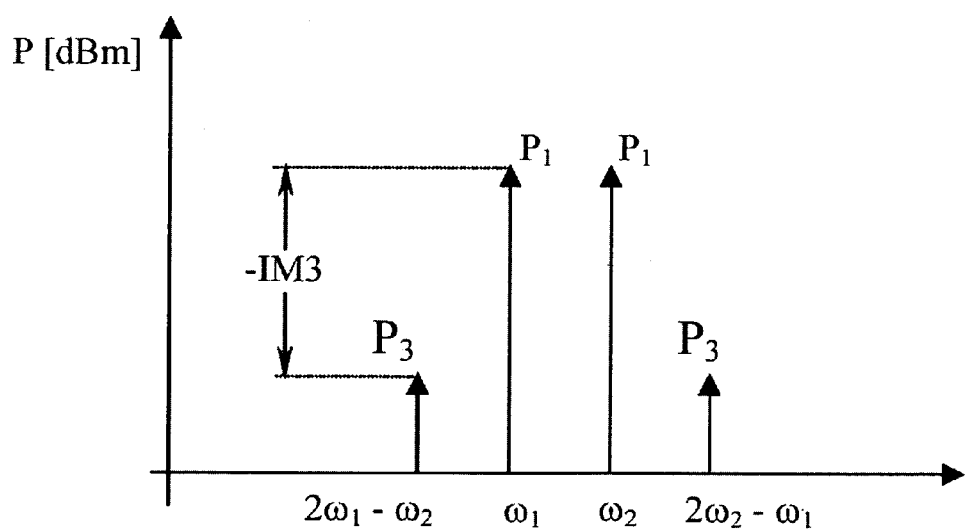
FIG. 2 illustrates the meaning of the parameter IM3 as in the prior art.
Figure 3:
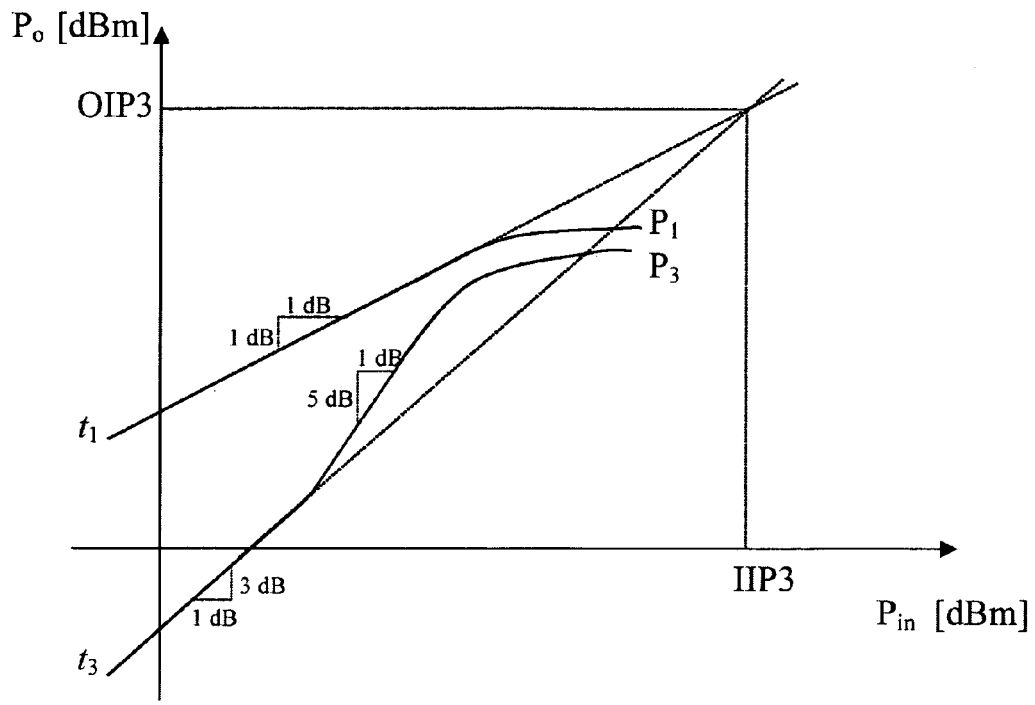
FIG. 3 depicts typical graphs of the output tones shown in FIG. 2.
Figure 4:
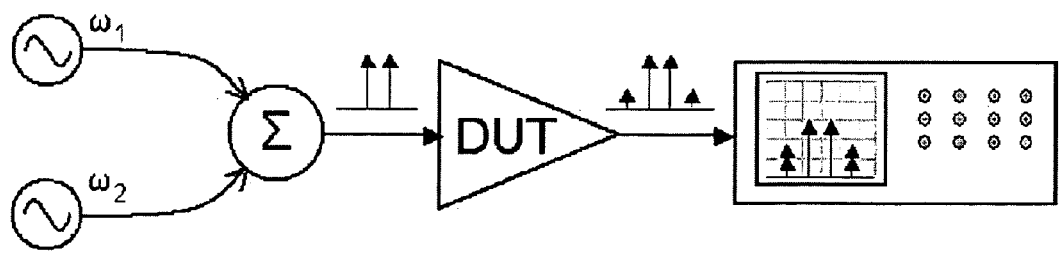
FIG. 4 shows a typical measurement arrangement as in the prior art.
Figure 5:
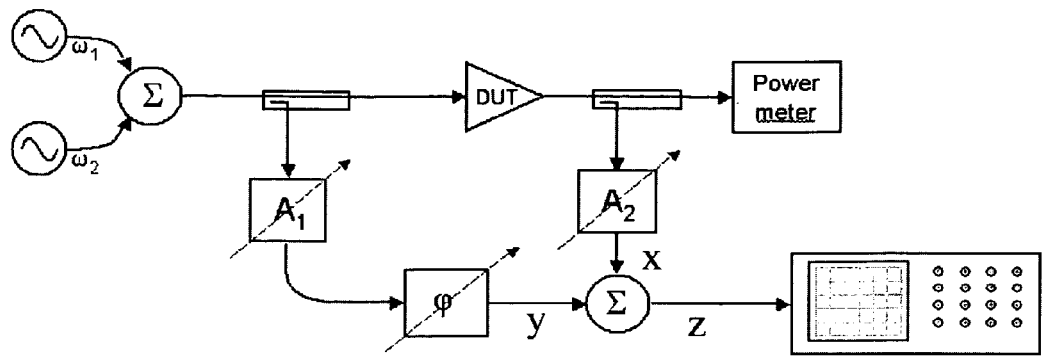
FIG. 5 shows a prior art arrangement for measuring characteristic distortion parameters, as discussed above.
Figure 7:
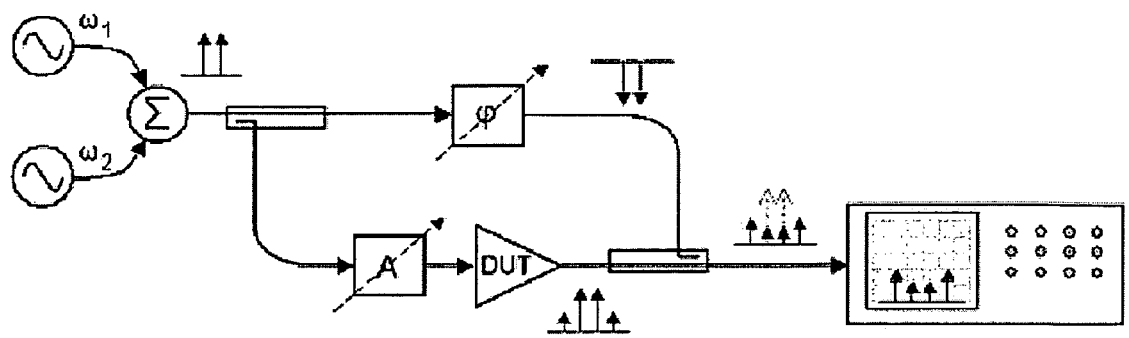
FIG. 7 shows an embodiment of an arrangement for measuring characteristic parameters of intermodulation distortion according to the present invention.

A block diagram of an embodiment of the measurement arrangement of this invention is shown in FIG. 7. Differently from the known circuit of FIG. 5, the generator of pairs of tones at test frequencies is connected to the input of the test device DUT through an attenuation path that attenuates the pair of tones according to an attenuation factor A equal to the gain G of the device DUT.

Along a signal phase shifting path of the measurement arrangement, the pair of tones is inverted by a phase-shifter φ of 180° and is added to the output of the device under test. The tones at test frequencies generated by the device DUT are canceled by the tones provided through the phase shifting path, thus the signal input to the spectrum analyzer is substantially provided only by the spurious tones due to the intermodulation distortion of the device DUT.

In the arrangement of FIG. 7, two "directional couplers" have been used because the test tones are at high frequency, but they may be replaced by any circuit capable of replicating the tones generated by the "power combiner" Σ and of adding the tones output by the device DUT with those produced by the phase-shifter φ.

It may be desired to make the attenuations that may be eventually introduced by the "directional couplers" or alternatively by circuits that perform the same function, compensate each other such that the output tones of the device DUT at the two test frequencies are canceled by the phase shifted tones produced by the phase-shifter φ.

If the power of the output tones of the device DUT is known, it is possible to measure the input and output third-order intercept points. It should be remarked that this measurement is performed with the maximum possible dynamic range, because the spurious tones are input to the spectrum analyzer without being attenuated. If the power of the output tones of the device DUT is not known, it may be measured by disconnecting temporarily the output of the device DUT from the "directional coupler" for connecting it to a measuring instrument.

Figure 8:
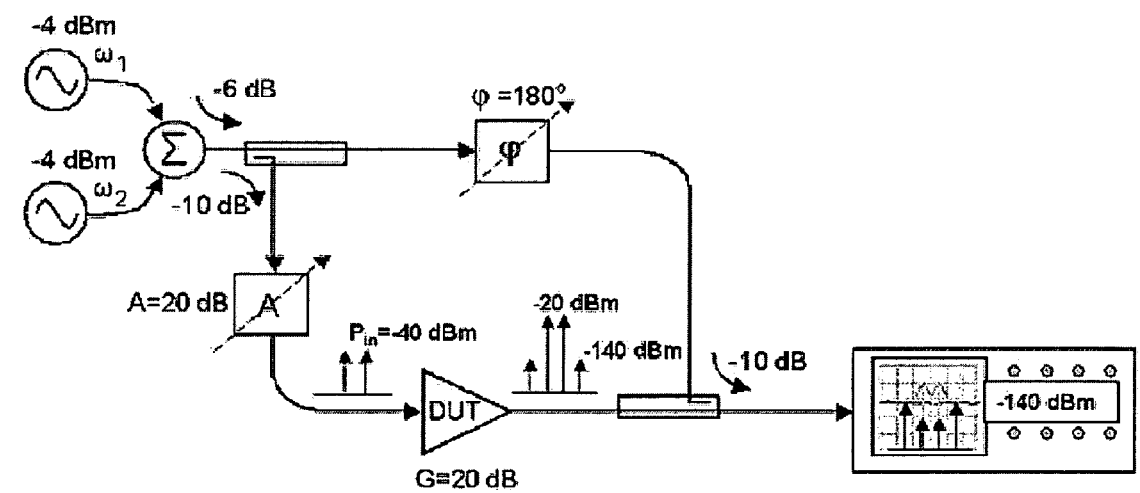
FIG. 8 shows a numerical example of a measurement carried out according to the invention.

To test the effectiveness of the circuit of this invention, reference is made to the numerical example shown in FIG. 8. The device DUT is fed with two tones of a power of −40 dBm and generates tones at the main frequencies having a power of −20 dBm and spurious output tones having a power of −140 dBm, equal to the background noise level of the spectrum analyzer.

The signal phase shifting path produces an inverted replica of the tones at the main frequencies output by the device under test DUT, that practically cancel out these tones and leave only the spurious tones that are input without any attenuation to the spectrum analyzer, and thus remain detectable because their level is at least equal to the background noise.

By knowing the power of the output tones of the device DUT it is possible to measure an output third-order intercept point OIP3 of 40 dBm. As a consequence, with the circuit of this invention, also in this limit case, the dynamic range of measurement is as large as possible.

Figure 6:
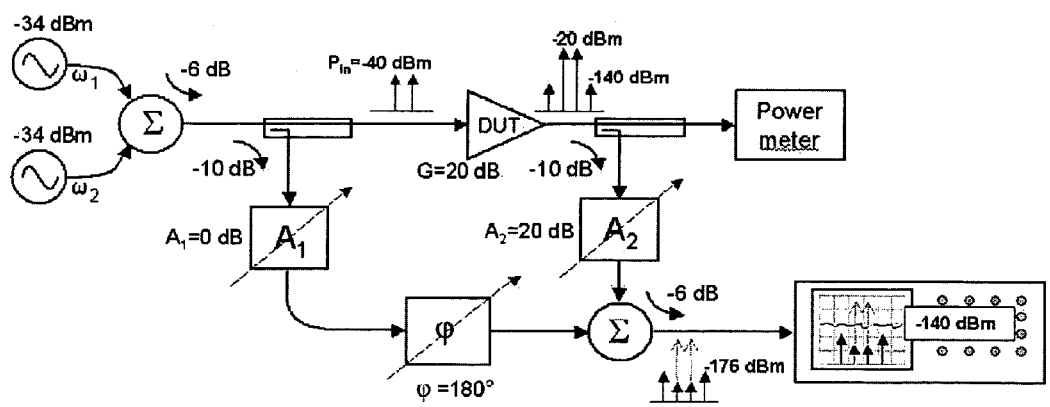
FIG. 6 shows a numerical example of a measurement carried out according to the prior art arrangement of FIG. 5.

Compared with the known method of Hassun and Kuhn, the method of this invention uses tones at main frequencies of larger power, as observable by comparing FIGS. 6 and 8. This is not a significant drawback because it is possible to generate high power tones in a relatively simple manner.

The arrangement of this invention allows measuring characteristic parameters of intermodulation distortion in the broadest possible range. Thus, it is of particular usefulness for testing highly linear devices, wherein spurious tones due to intermodulation distortion have a power level very close to that of background noise.

That which is claimed is:

1. An arrangement for measuring characteristic parameters of intermodulation distortion of a device under test (DUT) comprising:
   a generator of at least two tones at different test frequencies;
   an attenuation path feeding the OUT with a replica of the at least two tones attenuated by a factor equal to a gain of the DUT;
   a first circuit for generating a difference signal between a signal output by the DUT and the at least two tones; and
   a second circuit input with the difference signal and measuring the characteristic parameters of intermodulation distortion based upon the difference signal.

2. The arrangement of claim 1, wherein said first circuit comprises a phase-shifter for phase shifting the at least two tones by 180° to generate phase shifted replicas.

3. The arrangement of claim 2, wherein said first circuit further comprises an adder for adding the phase shifted replicas with the signal output by the DUT and downstream of said phase-shifter.

4. The arrangement of claim 3, further comprising a first directional coupler generating at least two replicas of the at least two tones, a first replica input to said attenuation path and a second replica input to said phase-shifter.

5. The arrangement of claim 4, wherein said adder comprises a second directional coupler identical to said first directional coupler that attenuates an output of said phase-shifter and adds it with the output of the DUT.

6. The arrangement of claim 1, wherein said second circuit comprises a spectrum analyzer.

7. An arrangement for measuring characteristic parameters of intermodulation distortion of a device under test (DUT) comprising:
   a generator of at least two tones at different test frequencies;
   an attenuation path feeding the DUT with a replica of the at least two tones attenuated by a factor equal to a gain of the DUT;
   an adder for generating a difference signal between a signal output by the DUT and the at least two tones; and
   a spectrum analyzer input with the difference signal and measuring the characteristic parameters of intermodulation distortion based upon the difference signal.

8. The arrangement of claim 7, further comprising a phase-shifter for phase-shifting the at least two tones by 180° to generate phase shifted replicas.

9. The arrangement of claim 8, wherein said adder adds the phase shifted replicas with the signal output by the DUT and downstream of said phase-shifter.

10. The arrangement of claim 9, further comprising a first directional coupler generating at least two replicas of the at least two tones, a first replica input to said attenuation path and a second replica input to said phase-shifter.

11. The arrangement of claim 10, wherein said adder comprises a second directional coupler identical to said first directional coupler that attenuates an output of said phase-shifter and adds it with the output of the DUT.

12. A method for measuring characteristic parameters of intermodulation distortion of a device under test (DUT) comprising:
   generating at least two tones at different test frequencies;
   generating input tones for the DUT by attenuating the at least two tones by a factor equal to a gain of the DUT;
   generating a difference signal by subtracting the at least two tones from the output signal of the DUT; and
   determining the characteristic parameters of intermodulation distortion based upon the difference signal.

13. The method of claim 12, wherein generating the difference signal comprises phase shifting the at least two tones by 180° to generate phase shifted replicas.

14. The method of claim 13, wherein generating the difference signal further comprises adding the phase shifted replicas with the signal output by the DUT.

15. The method of claim 14, wherein generating the input tones comprises using a first directional coupler to generate at least two replicas of the at least two tones.

16. The method of claim 12, wherein determining comprises using a spectrum analyzer.

* * * * *

UNITED STATES PATENT AND TRADEMARK OFFICE
CERTIFICATE OF CORRECTION

PATENT NO. : 7,265,557 B2 Page 1 of 1
APPLICATION NO. : 11/349305
DATED : September 4, 2007
INVENTOR(S) : Motta et al.

It is certified that error appears in the above-identified patent and that said Letters Patent is hereby corrected as shown below:

Column 1, Line 42    Delete: "$\omega_i$"
                     Insert: -- $\omega_1$ --

Column 1, Line 60    Delete: "ad"
                     Insert: -- and --

Column 5, Line 26    Delete: "OUT"
                     Insert: -- DUT --

Signed and Sealed this

Sixth Day of May, 2008

JON W. DUDAS
*Director of the United States Patent and Trademark Office*